(12) United States Patent
Tran et al.

(10) Patent No.: US 6,365,442 B1
(45) Date of Patent: Apr. 2, 2002

(54) EFFICIENT METHOD OF MAKING MICRO-MINIATURE SWITCH DEVICE

(75) Inventors: Dean Tran, Westminister; John Joseph Berenz, San Pedro; Luis M. Rochin, Temecula; Thomas J. Roth, Redondo Beach; Ronald A. DePace, Mission Viejo, all of CA (US)

(73) Assignee: TRW Inc., Lyndhurst, OH (US)

( * ) Notice: Subject to any disclaimer, the term of this patent is extended or adjusted under 35 U.S.C. 154(b) by 0 days.

(21) Appl. No.: 09/679,582

(22) Filed: Oct. 4, 2000

(51) Int. Cl.⁷ .............................................. H01L 21/82
(52) U.S. Cl. ...................................... 438/128; 438/133
(58) Field of Search ............................... 438/26, 51, 48, 438/64, 128, 133, 270, 106, 942, 943, 947

(56) References Cited

U.S. PATENT DOCUMENTS

| | | | |
|---|---|---|---|
| 2,793,260 A | | 5/1957 | Ciosek |
| 3,618,402 A | | 11/1971 | Kase |
| 4,495,814 A | | 1/1985 | Steinke |
| 4,555,946 A | | 12/1985 | Capaldi et al. |
| 4,736,629 A | | 4/1988 | Cole |
| 4,882,933 A | | 11/1989 | Petersen et al. |
| 4,901,570 A | * | 2/1990 | Chang et al. ................ 73/517 |
| 5,087,332 A | * | 2/1992 | Chen ........................... 205/135 |
| 5,096,535 A | * | 3/1992 | Hawkins ...................... 156/633 |
| 5,233,874 A | * | 8/1993 | Putty et al. .................. 73/517 |
| 5,248,861 A | | 9/1993 | Kato et al. |
| 5,331,853 A | | 7/1994 | Hulsing, II |
| 5,541,437 A | | 7/1996 | Watanabe et al. |
| 5,591,910 A | | 1/1997 | Lin |
| 5,635,739 A | | 6/1997 | Grieff et al. |
| 5,644,086 A | | 7/1997 | Cahill et al. |
| 5,804,783 A | | 9/1998 | Breed |

\* cited by examiner

*Primary Examiner*—David Nelms
*Assistant Examiner*—David Nhu
(74) *Attorney, Agent, or Firm*—Tarolli, Sundheim, Covell, Tummino & Szabo L.L.P.

(57) ABSTRACT

A method of making a micro-miniature switch device (10), which has at least one member (68) movable relative to a substrate (12) upon which the device is provided, includes providing a layer of sacrificial non-photolithography material upon a stratum connected to the substrate. A template is provided via photolithographing step that uses a photoresist material upon a stratum connected to the substrate. A layer is provided to include at least a portion of the movable member. The photoresist material and the sacrificial non-photolithography material are removed using photoresist developer. Preferably, at least two photolithography process steps utilize a single photolithographic mask. Also preferably, substrate material is removed to create a recess and at least one channel into the substrate, wherein the channel intersects the recess. At least a portion of the movable member is provided at a location within the recess and at least a portion of the movable member is provided at a location within the channel.

29 Claims, 6 Drawing Sheets

EFFICIENT METHOD OF MAKING MICRO-MINIATURE SWITCH DEVICE

TECHNICAL FIELD

The present invention relates to methods of making micro-miniature switch devices, and more particularly, to making micro-miniature switch devices utilizing semiconductor fabrication techniques.

BACKGROUND OF THE INVENTION

High-speed micro-miniature switch devices are used in various technologies, including, for example, vehicle safety systems and microwave relay systems. The number of applications for such switch devices is ever increasing. Thus, there exists an ever-increasing demand for such switch devices.

One example type of vehicle safety systems that often employ micro-miniature switch devices is occupant protection systems that include an air bag module, a seat belt pretensioner, or the like. Typically in such an occupant protection system, an electronic acceleration sensor provides an electrical signal that is proportional to sensed vehicle acceleration. A microprocessor assesses changes in the vehicle acceleration to determine whether the signal indicates that a vehicle crash event that requires actuation of the occupant protection device is in progress.

A safing switch is often used in combination with the acceleration sensor to provide a redundant level of detection for a vehicle crash event. The safing switch usually is designed and calibrated to close at a relatively early stage in a crash event. The occupant protection device is only actuated when the safing switch is closed and the microprocessor determines that the severity of the crash is sufficient to warrant such actuation. There is a current trend to use micro-miniature switches as the safing switches in the vehicle safing switches.

Processes generally similar to those to assemble other small mechanical devices may be used to manufacture micro-miniature switches. However, it is believed that large-scale manufacture of micro-miniature switches using such techniques would not be efficient.

Some efforts are being made to manufacture micro-miniature switches using techniques similar to those used to manufacture semiconductor components and/or micro-machined silicon elements. However, present manufacturing processes often require a relatively large number of process steps. The process steps may include the use of separate and distinct photolithography masks. Also, plural steps often require exact alignment between different masks so that a slight tolerance in each subsequent processing step does not result in errors that prevent the production of functional switches. In addition, each additional processing step generally adds to the cost of the final product.

SUMMARY OF THE INVENTION

In accordance with a first aspect, the present invention provides a method of making a micro-miniature switch device that has at least one member movable relative to a substrate upon which the device is provided. A layer of sacrificial non-photolithography material is provided upon a stratum connected to the substrate. A photolithographing step using a photoresist material upon a stratum connected to the substrate provides a template. A layer is provided to comprise at least a portion of the movable member. The photoresist material and the sacrificial non-photolithography material are removed using photoresist developer.

In accordance with a further aspect, at least two photolithography process steps of the method utilize a single photolithographic mask. In accordance with a yet another aspect, substrate material is removed to create a recess and at least one channel into the substrate, wherein the channel intersects the recess. At least a portion of the movable member is provided at a location within the recess and at least a portion of the movable member is provided at a location within the channel.

BRIEF DESCRIPTION OF THE DRAWINGS

The foregoing and other features and advantages of the present invention will become apparent to those skilled in the art to which the present invention relates upon reading the following description with reference to the accompanying drawings, in which.

DESCRIPTION OF AN EXAMPLE EMBODIMENT

Figure 1:
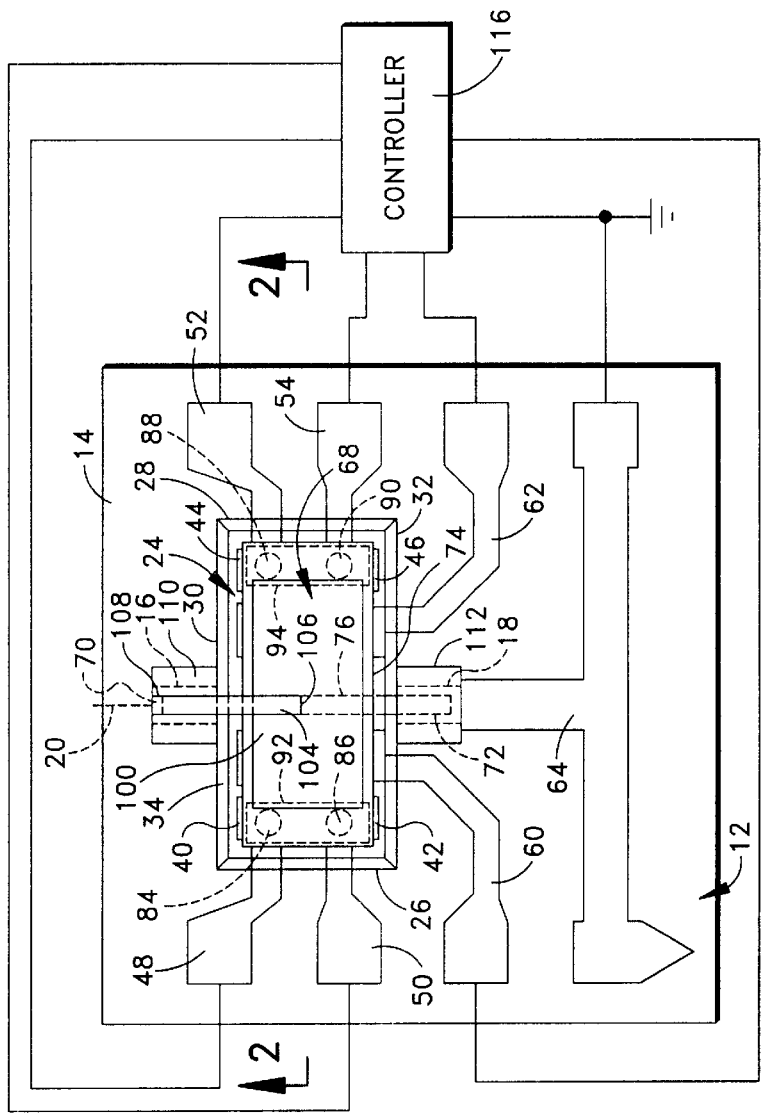
FIG. 1 is a top elevation of a switch device made in accordance with the present invention.

A micro-miniature switch device 10 that is made in accordance with an example embodiment of the present invention is illustrated in FIG. 1. Briefly stated, the switch device 10 includes a substrate 12 and a body 68. The body 68 is moveable relative to the substrate 12 between different switch conditions.

Figure 2:
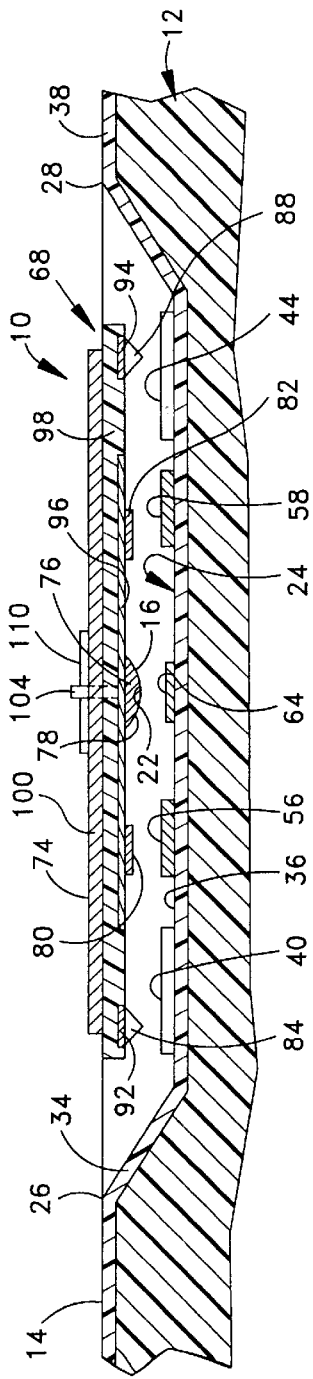
FIG. 2 is an enlarged view taken along section line 2—2 in FIG. 1.

Referring to FIG. 2, the substrate 12 has a substantially planar surface 14. The substrate 12, for example, may beta wafer of insulated indium phosphide, silicon, gallium arsenide, or other appropriate materials. In the illustrative embodiment described herein, a silicon substrate 12 is used.

It is to be noted that the substrate 12 may be composed of one or more layers. In the illustrated example, the substrate 12 has an under layer of silicon and an external layer 38 that is oxidized. Such layers may be the result of process steps that occur during making of the switch device 10. For the purpose of simplicity, and not as a limitation, the substrate 12 may be discussed herein as a unitary member. In addition, the relative dimensions of structure and material layers shown in the accompanying figures are for purposes of clarity of explanation and are not intended to be to scale, unless otherwise noted. Still further, relative direction and orientation terms, such as "above" and "below," are used merely as reference aids and are not intended as limitations.

First and second channels 16 and 18 (FIG. 1) are each defined by a sidewall 22 that extends a predetermined depth into the substrate 12 from the surface 14. The first and second channels 16 and 18 are spaced apart and oriented parallel to each other. Preferably, a common channel axis 20 extends longitudinally through both of the first and second channels 16 and 18, and the channels form a trough. Preferably, the first and second channels 16 and 18 have a depth of about 5 to 10 micrometers.

A recess 24 also extends into the substrate 12 from the surface 14 to a predetermined depth, which is greater than the depth of the first and second channels 16 and 18 (see FIG. 2). The recess 24 has spaced-apart end edges 26 and 28 and opposed side edges 30 and 32 (FIG. 1) extending between the ends. The recess 24 is oriented in an overlapping relationship with the trough defined by the first and second channels 16 and 18 so that the channels extend from and intersect the respective side edges 30 and 32. While the recess 24 is shown as being rectangular, it alternatively could be formed to have a different shape, such as circular, elliptical, trapezoidal, etc.

A perimeter sidewall portion 34 of the recess 24 extends from the edges 26–32 at the substrate surface 14 to a generally planar recessed surface 36 (FIG. 2) located within the recess. The sidewall portion 34 of the recess 24 could be slanted, as shown in FIG. 2, or curved relative to the surface 14.

The sidewall 22 of each channel (e.g., 16) intersects the sidewall portion 34 of the recess 24 at a respective adjacent side edge (e.g., 30) of the recess 24. In one example, the location of intersection of each channel (e.g., 16) with the side wall portion 34 is not equidistant from the end edges 26 and 28 of the recess 24.

The switch device 10 includes four electrical contact pads 40, 42, 44, and 46 disposed on the recessed surface 36 of the recess 24. Two contact pads 40 and 42 are visible in FIG. 2. Preferably, the contact pads 40–46, and all other elements to be discussed hereinafter that are located on the recessed surface 36, are actually located on the oxidized layer 38. The contact pads 40–46 are formed of electrically conductive material arranged in associated pairs (i.e., 40 and 42 are one pair and 44 and 46 are another pair). The first pair of contact pads 40 and 42 is located near a respective end edge 26 of the recess 24, and the second pair of contact pads 44 and 46 is located near a respective end edge 28 of the recess.

An electrical trace or transmission line (e.g., 48, shown in FIG. 1 but not FIG. 2) extends from each of the respective contact pads (e.g., 40) to a corresponding location external to the recess 24 to provide a pin terminal of the switch device 10. In the illustrated example there are four transmission lines 48, 50, 52, and 54 corresponding respectively to the four contact pads 40–46. The electrical condition (e.g., a voltage state) of each of the contact pads 40–46 may be monitored through the pin terminals associated with transmission lines 48–54, respectively.

Two elongated conductive plates 56 and 58 (FIG. 2) are disposed on the recessed surface 36 within the recess 24. Preferably, each of the conductive plates (e.g., 56) is located between the channel axis 20 and an adjacent pair of contact pads. An electrically conductive transmission line 60 (FIG. 1) is connected to and extends from the first conductive plate 56 to a location external to the recess 24, and an electrically conductive transmission line 62 is connected to and extends from the second conductive plate 58 to a location external to the recess. In the preferred example, each transmission line (e.g., 60) is connected to a respective pin terminal of the switch device 10. Each of the conductive plates (e.g., 56) is operative to provide an electrostatic field in response to electrical current provided through its corresponding transmission line (e.g., 60).

Another transmission line 64 preferably extends from the first channel 16 to the second channel 18, traversing the recess 24, and extends to a location external to the channels and recess. The transmission line 64 may be electrically connected to a reference voltage potential through an associated pin terminal of the switch device 10.

The contact pads 40–46, the conductive plates 56 and 58, and the transmission lines 48–54 and 60–64 are formed of electrically conductive materials, such as titanium/gold or titanium/platinum bi-layer.

Referring to FIGS. 1 and 2, the body 68 of the switch device 10 is located at the recess 24 and is movable into and out of engagement with the contact pads 40–46 disposed in the recess 24 to provide the switch function. The body 68 includes a central plate portion 74 (FIG. 1) and two arms 70 and 72 that extend outwardly from the central plate portion.

The arms 70 and 72 define the end portions of an elongated fulcrum rod 76 oriented parallel with the channel axis 20 and fixed relative to the central plate portion 74. The fulcrum rod 76 extends from the first channel 16 to the second channel 18. In particular, the arms 70 and 72 extend into and engage the sidewall 22 of the respective channels 16 and 18. The fulcrum rod 76 is formed of a rigid material, such as a metal, for example, nickel/gold or chromium/gold bi-layer.

Preferably, at least part of the arms 70 and 72 have a curved or semi-cylindrical lower surface 78 that approximates the contour of the semi-cylindrical side wall 22 of the respective channels 16 and 18. The curved lower surface 78 of the arms 70 and 72 rests in a bearing relationship with the side wall 22 of the first and second channels 16 and 18 so as to support the body 68 for movement relative to the substrate 12. This movement occurs as a result of rocking or sliding between the lower surface 78 of the arms 70 and 72 and the side wall 22 of the respective channels 16 and 18.

When the switch device 10 is configured to provide rocking movement, for example, the contact between the lower surface 78 of the arms 70 and 72 and the side wall 22 of the first and second channels 16 and 18 defines an axis of rotation for the body 68. This axis of rotation is substantially parallel to the channel axis 20 and may move along the sidewall 22 depending on the amount of relative rotation between the body 68 and the substrate 12.

The plate portion 74 of the body 68 is dimensioned and configured according to the dimensions and configuration of the recess 24. The plate portion 74 defines an inertial mass of the body 68. As such, the plate portion 74 is movable in the recess 24 about the channel axis 20.

The majority of the plate portion 74 is formed of a relatively thick layer 98 of a dielectric material. Further, the dielectric layer 98 provides a bulk of the mass of the plate portion 74. In one example, the dielectric layer 98 is formed of silicon oxide (silox), nitride or a stack consisting of silox/nitride/silox.

Preferably, a reinforcement layer 100 of rigid material, such as nickel/gold or chromium/gold bi-layer, is disposed over a substantial part of the dielectric layer 98. The reinforcement layer 100 provides additional rigidity to the plate portion 74. Alternatively, several smaller plates may be disposed over the dielectric layer 98 to provide additional rigidity.

Referring to FIG. 2, an electrically conductive plate 96 of the plate portion 74 is disposed between a central portion of the fulcrum rod 76 and the dielectric layer 98. The conductive plate 96 is preferably formed of gold and nickel.

The plate portion 74 includes a pair of electromagnetic plates 80 and 82 that are spaced apart from each other and located on opposite sides of the channel axis 20. The electromagnetic plates 80 and 82 are located on a lower surface of the plate portion 74. The conductive plate 96 electrically connects the electromagnetic plates 80 and 82 and the fulcrum rod 76.

Each of the electromagnetic plates (e.g., 80) is aligned with one of the conductive plates (e.g., 56) and is responsive to the electrostatic field provided by the corresponding conductive plate (e.g., 56). The plates 80 and 82 are formed of an electromagnetic material, such as iron cobalt, nickel cobalt, lead zirconate titanate, or another appropriate electromagnetic material.

Electrodes 92 and 94 are affixed to a lower side of the dielectric layer 98 and are located near opposite ends of the central plate portion 74. The electrodes 92 and 94 are each preferably formed of a layer of gold and a layer of nickel with an overall thickness of about five microns. The dielectric layer 98 electrically isolates the electrodes 92 and 94 and the conductive plate 96.

The central plate portion 74 also includes contact bumps 84, 86, 88, and 90 (FIG. 1). A first pair of contact bumps 84 and 86 is affixed to a lower surface of the first electrode 92, and a second pair of contact bumps 88 and 90 is affixed to a lower surface of the second electrode 94. The contact bumps 84–90 are formed of an electrically conductive material, such as gold or a combination of nickel and gold. Each of the contact bumps (e.g., 84) is aligned for contact with a respective one of the contact pads (e.g., 40). Preferably, each of the contract bumps (e.g., 84) has a conical configuration (see FIG. 2) with a pointed end extending toward the respective one of the contact pads (e.g., 40). The contact bumps 84–90 of the central plate portion 74 are the parts of the body 68 that actually engage the contact pads 40–46 disposed in the recess 24.

The switch device 10 also preferably includes a resilient flexure 104 that is connected with the central plate portion 74 and fixed relative to the substrate 12. The flexure advantageously provides torsion resistance to movement of the body 68 relative to the substrate 12. Preferably, the flexure 104 is formed of a resilient material, such as nickel or another metal. One end 106 of the flexure 104 is connected to a central part of the plate 74. The end 106 may be connected to the conductive plate 96 or the fulcrum rod 76, such as extending through an aperture which has been etched through both the reinforcement layer 100 and the dielectric layer 98. Another end 108 (FIG. 1) of the flexure 104 is fixed relative to the substrate 12, preferably attached to a reinforcement layer 110 fixed to the surface 14 of the substrate on opposed sides of the first channel 16. Another reinforcement layer 112 is fixed to the surface 14 of the substrate on opposed sides of the second channel 18. The reinforcement layers 110 and 112 also operate to hold the arms 70 and 72 within the respective channels 16 and 18.

The flexure 104 provides torsion resistance to movement of the body 68 relative to the substrate as well as stabilizes the body relative to the substrate 12. In addition, the flexure 104 operates to electrically connect the conductive plate 96 to the transmission line 64 that extends longitudinally through the first and second channels 16 and 18. Accordingly, the conductive plate 96 of the switch device 10 may be connected to a desired voltage potential, such as electrical ground, through the transmission line 64.

With regard to the operation of the switch device 10, switch conditions are provided in response to a pair of contact bumps (e.g., 84 and 86) electrically connecting the associated pair of contact pads (e.g., 40 and 42). As stated above, each of the conductive plates 56 and 58 may be energized with a selected amount of electric current to provide an electrostatic field that urges the adjacent portion of the central plate portion 74 toward or away from the energized conductive plate. Advantageously, the electromagnetic plates 80 and 82 are responsive to electrostatic field to help improve the performance and responsiveness of the switch device 10, such as when either of the conductive plates 56 or 58 is energized. One or both of the conductive plates 56 and 58 may be energized in a predefined manner for testing the operation of the switch device 10.

When the conductive plate 56 is energized, for example, it generates an electrostatic field that urges the adjacent part of the central plate 74 into the recess 24 toward the energized plate. This causes the contact bumps 84 and 86 to engage the associated contact pads 40 and 42, thereby completing an electrical circuit defined by the electrical contact pads and their corresponding transmission lines 48 and 50. The electrical connection defines a switch condition that may be monitored.

Similarly, the other conductive plate 58 also may be energized to provide an electrostatic force that urges the other end of the body 68 toward the lower energized plate within the recess 24. This results in the contact bumps 88 and 90 engaging the contact pads 44 and 46, thereby electrically connecting contact pads through the electrode 94, to define another switch condition. The electrical connection defines another switch condition that may be monitored.

Because the amount of electrostatic field is variable based on the electrical current provided through transmission lines 60 and 62, one of the conductive plates 56 or 58 may be energized to inhibit movement of the body 68 from one condition to another condition. The electrical current and, in turn, the electrostatic field may be controlled to inhibit such movement when the switch device 10 is exposed to less than a predetermined amount of acceleration along a direction substantially orthogonal to the surface 14 of the substrate 12. However, if the switch device 10 is sufficiently accelerated along a direction orthogonal to the surface 14 of the substrate 12, the body 68 overcomes the electrostatic field and moves from one electrical condition to another electrical condition.

Simply breaking an electrical connection between a pair of pads may indicate a change in switch condition. For example, such a change in switch condition occurs during movement from an electrical contact position to a neutral position shown in FIG. 2. Sensing a change in switch condition is advantageous for detecting acceleration of the switch device 10 above a threshold defined by the amount of force provided by a controlled electrostatic field. In addition to the conductive plates 56 and 58 that operate to urge an end of the body toward the recessed surface 36 of the substrate 12, the body 68 may be asymmetric so that a greater mass is on one side of the arms 70 and 72. This also will provide additional resistance to movement of the body 68 relative the substrate 12. Accordingly, such asymmetry in the body 68 must be considered when implementing the switch device 10 as an acceleration safing switch.

The switch device 10 in accordance with the present invention may be used as a safing switch or acceleration-sensing device. The surface 14 is oriented orthogonal to the direction along which acceleration is to be sensed. The switch device 10 thus is able to detect a vehicle for sensing a vehicle crash event in when the vehicle is accelerated along a direction substantially orthogonal to the surface 14 of the substrate 12. A plurality of such switch devices further may be used to detect acceleration above a threshold along one or more selected directions.

In order to monitor the switching conditions of the switch device 10, the transmission lines 48–54 may be electrically connected to external circuitry, such as a controller 116, schematically illustrated in FIG. 1. The controller 116, for example, may be microprocessor or micro-controller programmed to detect a change in the electrical condition of the switch device 10. The controller 116 further may be part of the control circuitry for a vehicle occupant protection system. The controller is operative to control actuation of an associated vehicle occupant protection device, such as an air bag or seat belt pretensioner (not shown).

The controller 116 is connected to the conductive plates 56 and 58 through transmission lines 60 and 62 to control the electrostatic forces provided thereby. Accordingly, the controller 116 is operative to control the level of acceleration sufficient to change switch conditions.

The switch device 10 is fabricated using semiconductor fabrication techniques. FIGS. 3–12 represent one preferred example of a fabrication process. It is to be appreciated that FIGS. 3–12 show several intermediate stages of the switch device 10 during the process. It is to be further appreciated that each Figure represents a plurality of steps that have been performed, and that materials, etc. used to obtain the intermediate stages are typically not shown.

Figure 3:
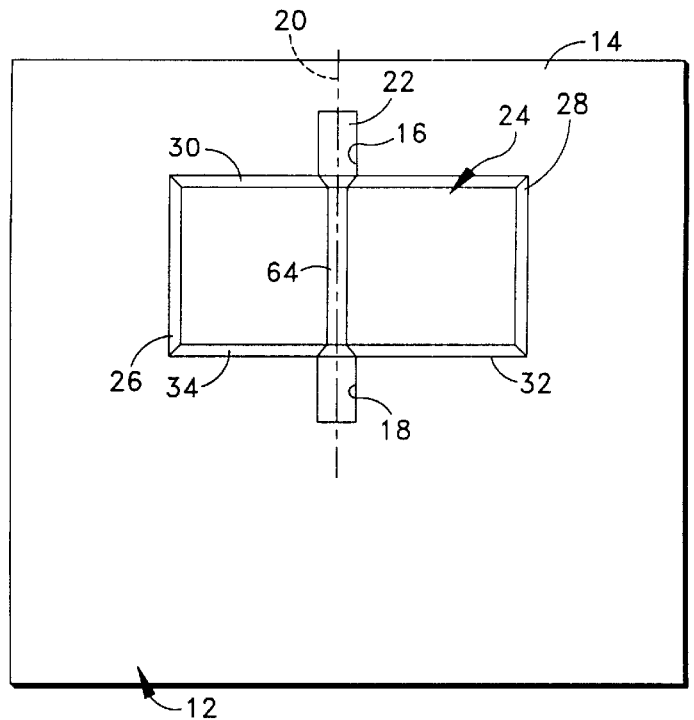
FIGS. 3–12 are successive views during manufacture of the switch device of FIG. 1.
Figure 4:
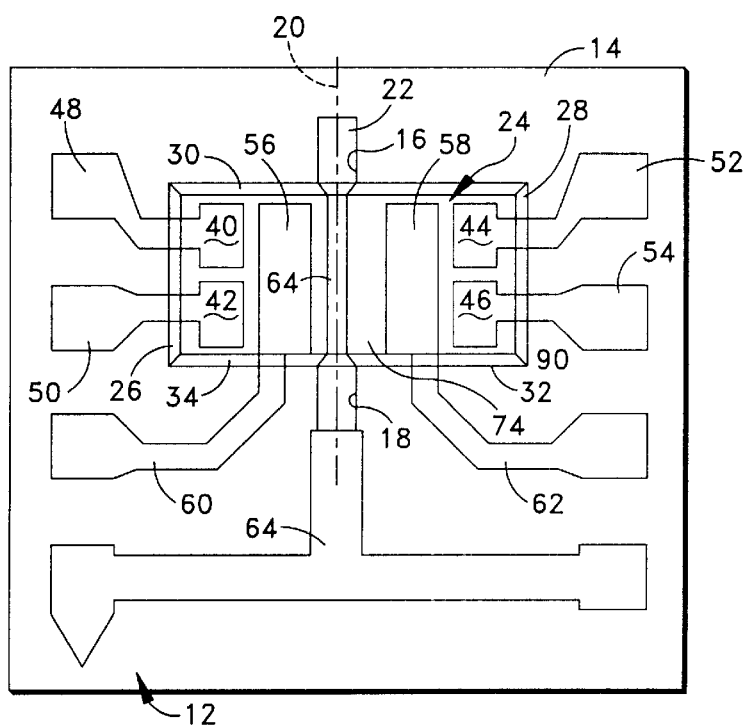

The process is initiated by providing the substrate 12 (FIG. 3). As mentioned, the substrate 12 is a wafer that is composed of insulated Indium Phosphide, Gallium Arsenide, or Silicon. The first and second channels 16 and 18 are created in the substrate 12 via photolithography using a U trough mask (not shown) to define the areas of the channels 16 and 18.

Specifically, the substrate 12 is coated with a positive photoresist. In one example, a photoresist AZ4620 is used. The photoresist AZ4620 contains 2-ethoxy acetate (48%)+ N-butyl acetate (5%)+Xylene (5%)+cellosolve acetate mixed with Cresol Novolak resin, 2,1,5-diazonaphthoquinone sulfonic acid with 2,3,4-trihydroxybenzophenone. This photoresist can be replaced by any thick positive photoresist with viscosity about 375 CST.

The photoresist is cured at 110° C. for 45 minutes. Then, the photoresist is exposed to ultraviolet light at 300 mJ/cm$^2$ using the U trough mask. After exposure, the photoresist is developed. As an example, the photoresist developer is AZ400K, which contains 6% sodium hydroxide in de-ionized (DI) water. Further, the photoresist developer is diluted for use at a ratio of 1:4 with de-ionized water.

During the developing, the substrate 12 is soaked in the diluted solution until the locations of the first and second channels 16 and 18 are clear of photoresist material. Specifically, the photoresist material is completely removed at designated locations. If another photoresist is utilized, the photoresist, the developer, etc. must be matched with that photoresist system, otherwise that photoresist may not properly develop away.

The substrate 14 is chemically etched to form the first and second channels 16 and 18. The chemical etching is via a non-selective orientation etchant. For example, if the substrate 12 is Indium Phosphide, the etchant used includes Potassium Dichromate solution (14.7 gram in 100 mil of De-Ionized water), Hydro bromide acid, and Acetic acid solution. One example ratio of liquid volume for the three components is 4.5/3/1, respectively. Also, in one example, the etching temperature is at approximately 50 to 60° C. The etching extends down 5 to 10 microns from the surface 14.

After the first and second channels 16 and 18 are formed, the substrate 14 is soaked in a neutralizing solution. In one example, the neutralizing solution includes sulfuric acid, hydrogen peroxide, and de-ionized water in a liquid volume ratio of 3/1/1, respectively. The neutralizing solution is applied at room temperature for 30 minutes to neutralize the effect of the etchant, and in particular neutralize the effect of bromide residue.

After neutralization, the substrate is rinsed in running de-ionized water for 60 minutes. A nitrogen-stream is utilized to blow dry the substrate. The photoresist is removed using acetone. Any remaining photoresist residue is removed by photoresist stripper or soap and de-ionized water rinsing.

In order to create the recess 24, another photolithography procedure is first performed. The photolithography process associated with the creation of the recess 24 is very similar to the photolithography process associated with the first and second channels 16 and 18. However, the photolithography process associated with the creation of the recess 24 is performed with a recess mask.

Once photolithography is complete to expose an area that will be etched to create the recess 24, the recess is created by chemical etch. As an example, if the substrate indium phosphide, the etching solution of potassium dichromate solution, hydro bromide acid, and acetic acid mentioned above can be utilized. Typically, the chemical etch is performed at room temperature. The etching creates the recess 24 to a depth of 20 to 30 microns.

Once the etching of the recess 24 is complete, the etchant is neutralized. After neutralization, the photoresist material is removed using acetone. Any remaining photoresist residue is removed via the use of photoresist stripper or soap and de-ionized water rinse.

At this point, the substrate 12 has the first and second channels 16 and 18 and the recess 24 created therein. At this time, the oxidized layer 38 (FIG. 2) is created. Specifically, the oxidized layer 38 is created via the thermal oxidation. The substrate 12 is heated at high temperature and in the presence of water vapor and oxygen. Such a procedure is often referred to as wet oxidation reaction. If the substrate is made of silicon, the oxidation occurs at 800° C. If the substrate is made of indium phosphide or gallium arsenide, the oxidation occurs at 400 to 600° C.

The next group of steps (see FIG. 3) is for the creation of contact pads 40–46, conductive plates 56 and 58, and transmission lines 48–54, 60–64. Specifically, a photolithography procedure is performed using a bottom contact mask. Preferably, the procedure is a lift-off method.

The photolithography method is different than the photolithography method utilized to create the first and second channels 16 and 18 and the recess 24. First, the substrate 12 is spin-coated or vapor-primed with hexamethyl disilazane, and spin-coated with photoresist material. The photoresist material is cured at temperature of 100° C. for 60 minutes. Subsequently, the photoresist material is exposed to a high dose of ultraviolet energy. For example, the exposure may be 1,000 mJ/cm$^2$. As an alternative to flood exposing the photoresist material with a high dose of ultraviolet energy, the substrate 12 with its coating of photoresist material can be soaked in chlorobenzene for 6 to 10 minutes.

The substrate 12 is then re-coated with photoresist material. The curing and developing of the second layer of photoresist material is similar to the curing and developing that is performed for the photoresist layer associated with the creation of the first and second channels 16 and 18 (i.e., cured at 110° C. for 45 minutes, exposed at 300 mJ/cm$^2$)

Contact metal is evaporated onto the substrate 12. The contact metal is utilized for the creation of the contact pads 40–46, the conductive plates 56 and 58, and the transmission lines 48–54 and 60–64. The evaporation of the metal is by electron beam evaporation.

The contact metal is preferably a layering of titanium, platinum, and gold. For the titanium/platinum/gold layering, a thickness arrangement of the layers is, for example, 500/1000/5000 Å, respectively. In the alternative, a layering of chromium and gold may be used.

The photoresist material, and any metal on the photoresist material, is removed via a lift-off method. Specifically, the photoresist material is removed by pressurized spray of acetone. The spray of acetone is typically at 25 psi. Subsequently, the substrate 12 is spray-cleaned with methyl alcohol and then spray-cleaned with isopropyl alcohol. The substrate 12 is then dried via use of a nitrogen gas blow.

The substrate 12 is cleaned via a suitable procedure. Subsequently, a sacrificial layer of metal is deposited upon the substrate 12. The sacrificial metal may be aluminum or copper and may be 1000 to 5000 Å thick. The sacrificial metal is later removed and the removal permits freedom of movement between parts subsequently created and the parts fixed to the substrate 12.

A photolithography procedure using the same bottom contact mask to create the contact metal for the contact pads 40–46, the conductive plates 56 and 58, and the transmission lines 48–54, 60–64 is utilized. Within this photolithography procedure, photoresist material is coated onto the substrate 12. The photoresist material is cured (e.g., at 100° C. for 45 minutes, and exposed with ultraviolet light at 300 mJ/cm$^2$).

The photoresist material is then developed using photoresist developer. Within this photolithography procedure, the photoresist developer contains an alkaline salt such as tetramethyl ammonium hydrozide ((CH3)$_4$NH$_4$OH) or sodium hydroxide (NaOH) or other alkaline salt that etches away the thin aluminum film where the photoresist material is developed down to the aluminum layer. Specifically, the aluminum is only removed at the locations of the contact pads 40–46 and the conductive plates 56 and 58. It should be noted that the developing time is extended longer than what would normally be necessary to develop away the photoresist material. Accordingly, with a single step of using photoresist developer, photoresist material and aluminum are removed.

Another approach that can be used is after the photoresist material is developed down to the aluminum layer, the substrate 12 is rinsed in de-ionized water. The aluminum layer is then etched away by aluminum etchant. Depending upon the aluminum layer thickness, one of the following solutions can be used:

$4H_3PO_4+4CH_3COOH+1HNO_3+1H_2O$ or

75 g $Na_2CO_3$+35 g $Na_3PO_4$+12$H_2O$+16 g $K_3Fe(CN)_6$ or

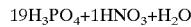
$19H_3PO_4+1HNO_3+H_2O$ or

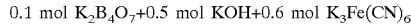
0.1 mol $K_2B_4O_7$+0.5 mol KOH+0.6 mol $K_3Fe(CN)_6$ or

20% NaOH in DI water

However, the use of a separate aluminum etchant does not have the benefit of a reduction in processing steps.

It should be noted that the presence of the sacrificial metal (e.g., aluminum) layer acts as an electrical conductor to improve subsequent plating. Specifically, plating that occurs at a next step is aided. The plating provides a thicker metal layer to finish creation of the contact pads 40–46, and the conductive plates 56 and 58. In one example, the plating includes a sequential layering of nickel and gold, to a thickness of 2 to 9 microns.

The photoresist material that is present on the substrate 12 is removed using acetone. Any remaining photoresist material residue is removed by using photoresist stripper or soap and de-ionized water rinse, or oxygen/argon plasma.

Figure 5:
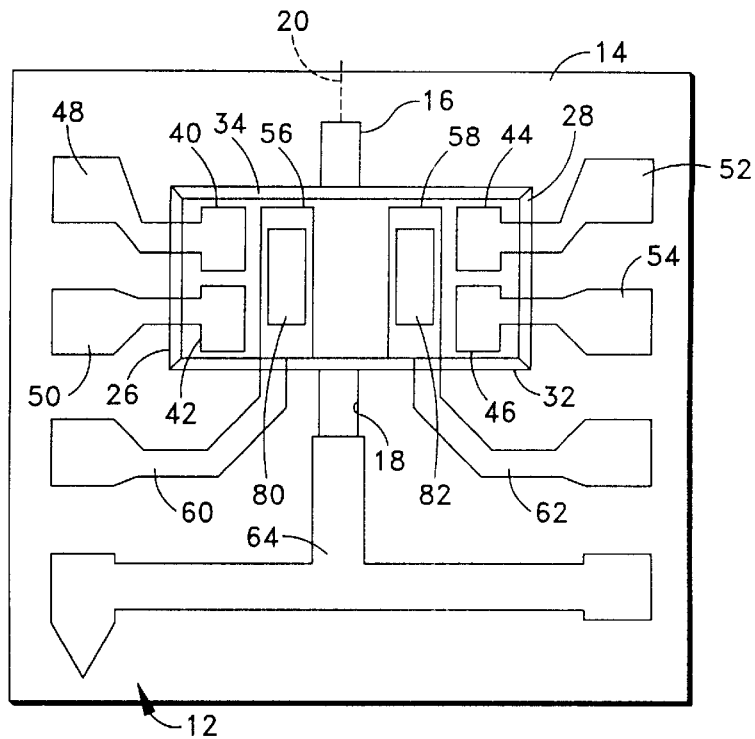

FIG. 5 illustrates the portions of the switch device 10 created by the next part of the process. Specifically, the electromagnetic plates 80 and 82 are created. A photolithography process utilizing an electromagnetic plate pattern mask is utilized. The process of the photolithography procedure is generally the same as the photolithography procedure that was performed to expose the sacrificial aluminum layer for deposition of the thick metal that created the contact pads 40–46 and the conductive plates 56 and 58. In brief summary, the substrate 12 is coated with photoresist material, cured, and then exposed. Finally, the photoresist material is developed utilizing a photoresist developer that contains an alkaline salt. The developing of the photoresist material results in etching of the sacrificial metal layer. Again, this layer is sacrificial in that it would be further removed at a later step. However, its presence results in improved subsequent plating.

Plating occurs at the next step and is done to deposit electromagnetic material such as iron cobalt to create the electromagnetic plates 80 and 82. The deposition is via electron beam evaporation similar to the process utilized to deposit the contact material for the contact pads 40–46 and the conductive plates 56 and 58. After the plating is complete, the photoresist material and any electromagnetic material located upon the photoresist material is lifted off and the substrate 12 is cleaned with solvent only.

The space within the recess 24 is planarized using a polymethyl methacrylate. The substrate 12 is baked at 165° C. for 30 minutes to remove all moisture. The substrate 12 is then cooled for 5 minutes. A spin-coat of polymethyl methacrylate of 4–11% is applied. Specifically, in one example, the substrate 12 is rotated at 2000 rpm for 30 seconds to apply the spin-coat of the polymethyl methacrylate. The substrate 12 with the layers of polymethyl methacrylate are baked, again. For example, the baking is at 160° C. for 30 minutes. The spin-coating to apply polymethyl methacrylate and baking each subsequent layer continues until the recess is filled and thus planarized. At that point, the substrate 12, with the polymethyl methacrylate coating, is exposed to ultraviolet energy.

The polymethyl methacrylate is developed in Methyl IsoButyl Ketone (MIBK) developer until the portion of the substrate other than the recess 24 is clear of polymethyl methacrylate. It is to be appreciated that polymethyl methacrylate is still within the recess 24 and is coplanar with the substrate surface 14. The substrate 12 is then rinsed in isopropyl alcohol for 30 seconds. This is followed with a rinse in de-ionized water for 5 to 10 seconds. Drying is accomplished by blowing nitrogen gas onto the substrate 12.

Figure 6:
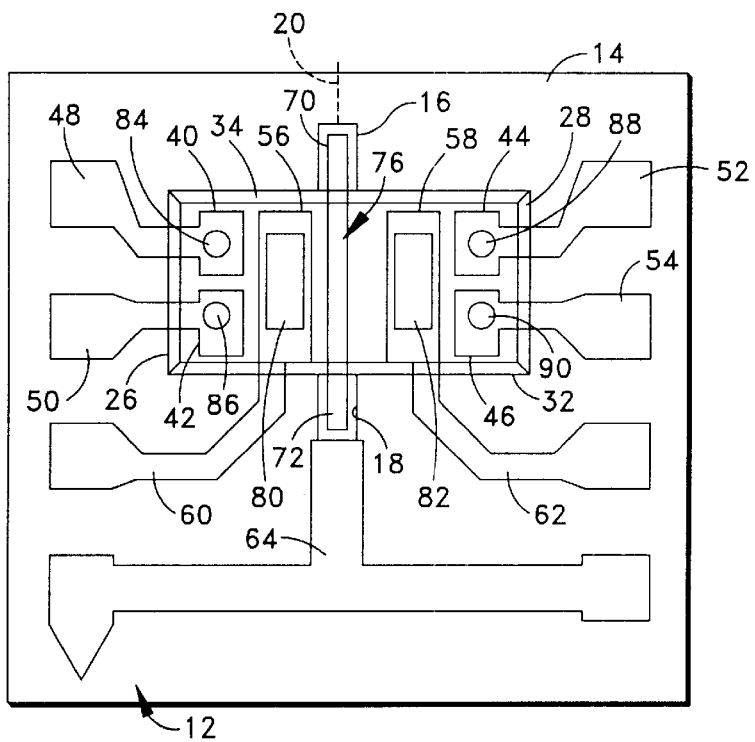

FIG. 6 illustrates the portions of the switch device 10 created by the next part of the process. Specifically, the fulcrum rod 76 and the contact bumps 84–90 are created. A photolithography procedure is performed utilizing a fulcrum rod and contact bump mask. The photolithography procedure is generally the same as that which was performed to provide the first and second channels 16 and 18. A polymethyl methacrylate material is partially etched at the intended locations of the fulcrum rod 76 and the contact bumps 84–90. The etching is to a depth of approximately 3–5 microns. An MIBK developer can be utilized.

A thin film of sacrificial metal is deposited upon the substrate 12. For example, the thin film material may be aluminum that has a thickness of 1000–20000 Å. A lithography procedure is again performed utilizing the same fulcrum rod and contact bump mask. Within this photolithography procedure, development time of the photoresist material is calibrated such that the aluminum is not etched. In other words, development time is permitted in accordance with the thickness of the photoresist material.

A plating of thick metal is provided such that the fulcrum rod 76 and the contact bumps 84–90 are created. The plating is provided via a layer of nickel and then gold or as an alternative only gold. The plated metal is 3–10 microns thick.

Figure 7:
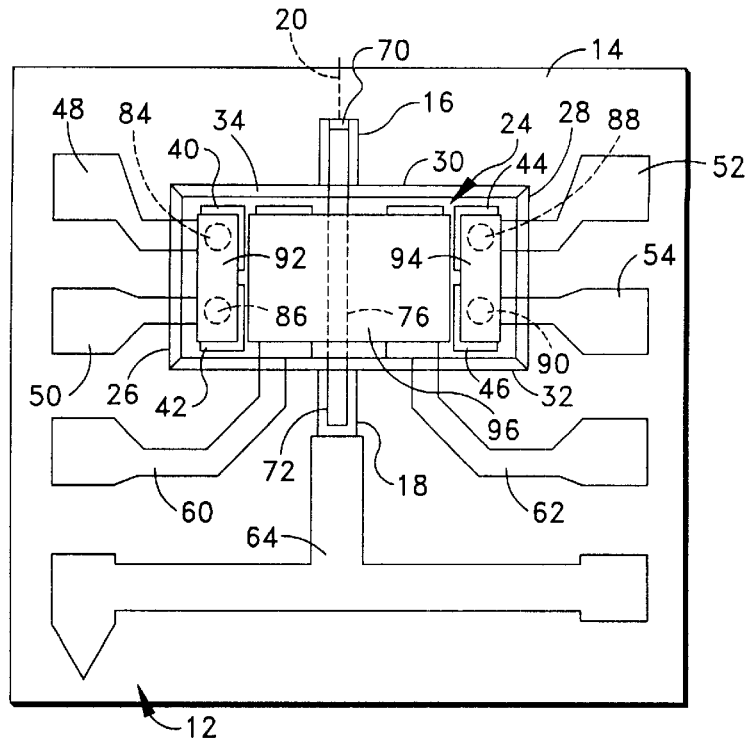

FIG. 7 is an illustration related to fabrication of the electrodes 92 and 94 and the conductive plate 96. The substrate 12, with its covering layers of photoresist material that has not yet been removed is flood exposed to ultraviolet light. Another coating of photoresist material is provided onto the substrate 12. The new photoresist material is processed similar to the photoresist material utilized in the creation of the first and second channels 16 and 18. Specifically, the photoresist material is cured and exposed to UV light.

A top contact mask (i.e., for the electrodes 92 and 94, and the conductive plate 96) is aligned onto the substrate 12. The photoresist material is accordingly exposed and developed. The development of the photoresist material is maintained until the sacrificial layer of metal (e.g., aluminum) and the contact bumps are visible. A thick metal layer is then deposited onto the substrate 12, targeting the developed areas. The thick metal layer is comprised of subsequent portions of gold, nickel, and gold. The layering is to a depth of 3–10 microns.

The substrate 12 is then flood exposed to UV light. The photoresist material is removed using photoresist developer. The time of development is calibrated such that the aluminum sacrificial layer is not etched away. The substrate 12 is cleaned using oxygen plasma.

Figure 8:
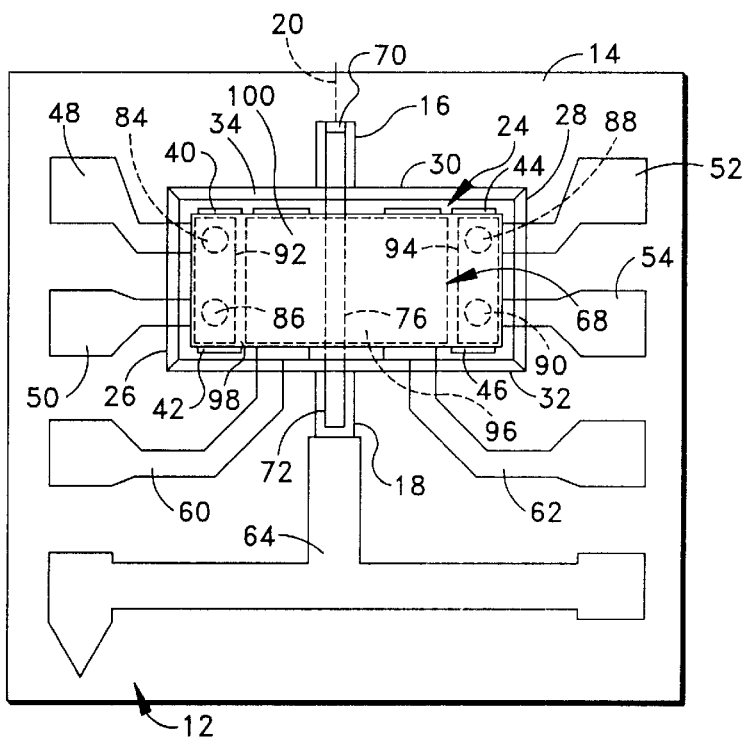

FIG. 8 relates to the portion of the process associated with formation of the dielectric layer 98 of the body 68. Specifically, an evaporation process, a sputtering process, or a chemical vapor deposition process is utilized to deposit the dielectric layer 98. The material of the dielectric layer 98 may be silox or nitride, or a stacked layering of silox, nitride, and silox.

A photolithography procedure of the process is performed that utilizes a wing mask (i.e., for the body 68). The photolithography procedure is a light field photolithography procedure. The field dielectric is then etched. The etching may be by a dry etching procedure using a dry etchant such as ECR, ICP, or RIE. Alternatively, a wet etch procedure may be utilized with a buffer HF or commercial etchant.

Figure 9:
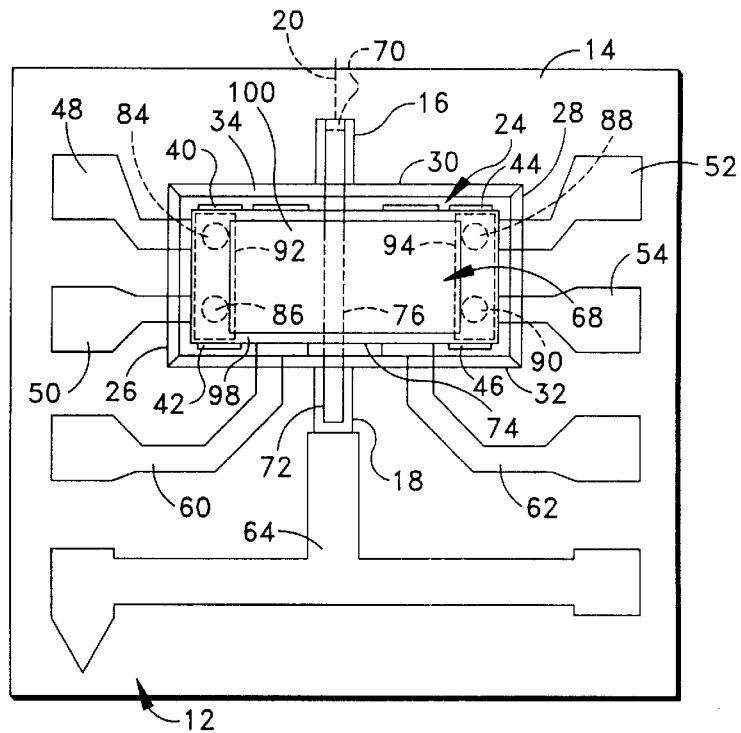

FIG. 9 relates to the portion of the procedure for providing the reinforcement layer 100 onto the body 68. Specifically, a photolithography procedure is performed that utilizes a wing/hinge fulcrum mask. Further, the photolithography process is a lift-off process. Metal that forms the reinforcing layer is evaporated onto the substrate 12. In one example, a layering of nickel and gold is utilized. The thickness of the layering is 5000 Å to 2 microns.

The lift-off process is used to remove excess material. The lift-off process entails soaking in hot acetone.

Figure 10:
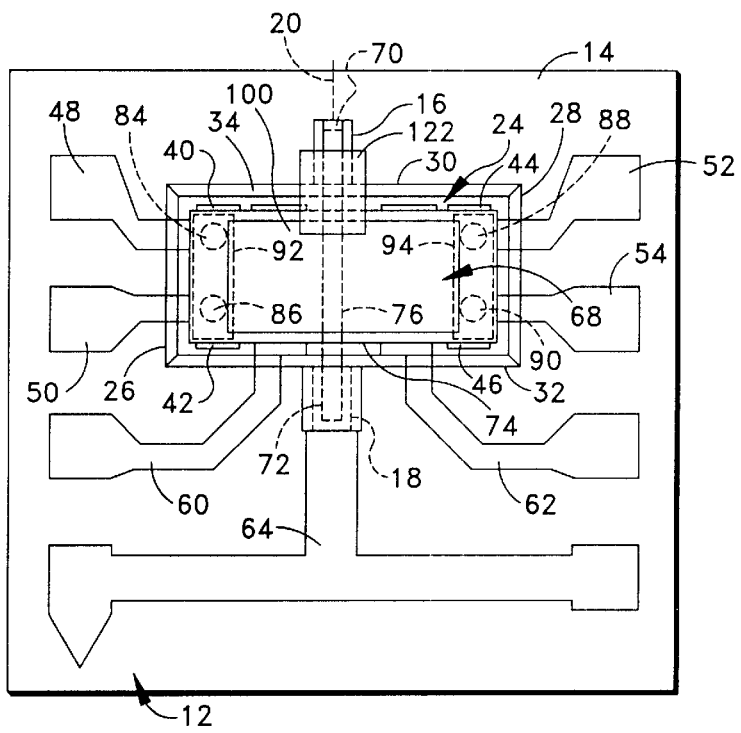

FIG. 10 illustrates the portion of the process for providing air-bridging portions 122 and 124 that are subsequently used to provide the flexure 104, with its air-bridge, and the reinforcement layer 110 and 112. Specifically, the substrate 12 is spin-coated with a negative photoresist material. The substrate 12 is then baked for 30 minutes.

The substrate 12 is exposed to ultraviolet light utilizing an air-bridge isolation mask. It is to be appreciated that the air-bridge isolation mask is a dark field mask. The level of ultraviolet light used is dependent upon the thickness of the negative photoresist material. The photoresist material is then developed utilizing developing procedures discussed above. The substrate 12 is then cleaned via oxygen plasma to remove photoresist residue and leave the temporary air-bridging portions 122 and 124.

Figure 11:
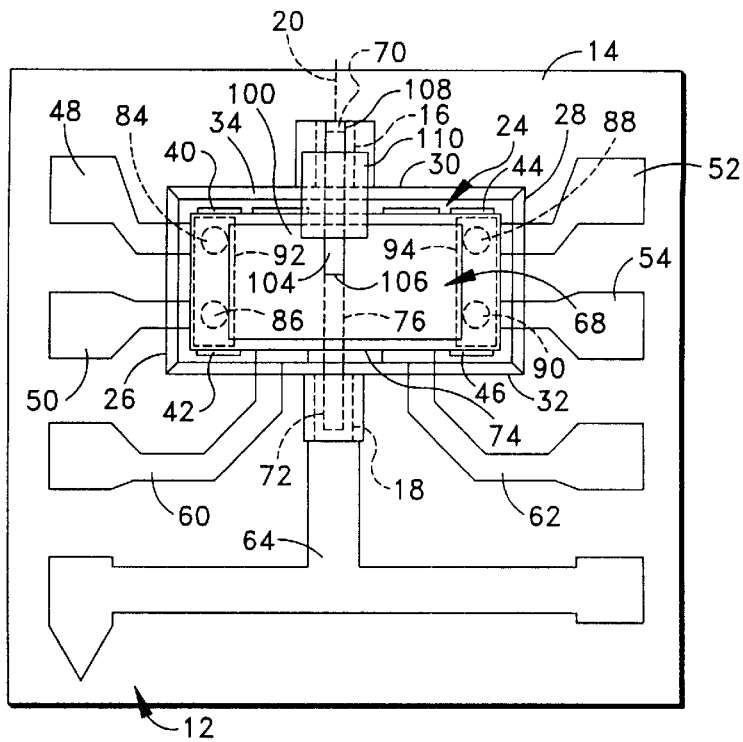

FIG. 11 relates to the portion of the process for forming the flexure 104 and the reinforcement layers 110 and 1112. Specifically, a photolithography procedure using an air-bridge formation mask is performed. The photolithography procedure is a lift-off method similar to the lift-off method described above.

A metal layering is provided via an evaporation process. The layering includes three metal layers. The first metal layer is gold, the second metal layer is nickel or chromium, and the third metal layer is gold. The thickness' associated with the respective layers are 1000, 5000–10000, and 5000 Å, respectively.

Soaking the substrate 12 in hot acetone performs a lift-off procedure. Finally, residue is cleaned away using oxygen plasma. Thus, the air-bridged flexure 104 and the reinforcement layers 110 and 112 remain leaving the switch device 10 with the appearance of FIG. 12. A few steps remain to complete the switch device 10. However, before the remaining steps are discussed, an example of a technique for the air-bridge processing is provided.

The one example of a technique for the air-bridge formation includes dehydration baking of the substrate 12 at 165° C. for 30 min. The substrate 12 is then cooled for 5 min. A spin coating of the substrate 12 with PMMA (the PMMA thickness may vary from 1 micron to 5 microns) is provided. Again, the substrate 12 is baked at 165° C. for 30 min. Metal (e.g., Titanium) is evaporated onto the substrate to a certain thickness (e.g., 300–500 Å). A coating standard positive photoresist (example 1813 PR) is applied. The substrate is then air dried for 20–630 min.

Baking of the substrate 12 occurs at 90° C. for 45 min. The substrate 12 is them UV exposed with air-bridge definition mask (i.e., the light field mask). The photoresist is developed, and then the substrate is oxygen plasma descumed. The field metals are then etched using Titanium etchant. The photoresist on the substrate 12 is flood exposed and then stripped using a solution of resist developer/DI water (in a ration of 1:1) or concentrate developer. The PMMA is subject to deep UV exposure.

The titanium is then etched, and the PMMA is developed using MIBK developer. The substrate is rinsed, first in Isopropyl alcohol, and then in de-ionized water to remove MIBK residue. The substrate is then blown dry using Nitrogen, descumed in oxygen, and then rebaked at 165° C. for 30 min.

A lift off photolithography is performed. The process includes spin coating with positive photoresist, baking, and soaking in chlorobenzene (7 to 10 min. depending on the photoresist used). The photoresist is then exposed with the air-bridge mask, developed (slightly over develop compares to the standard developing time requires), and then oxygen plasma descumed. The metals (example Ti/Ni/Au or Ti/Au) for the flexure 104 and the reinforcement layers 110 and 112 are evaporated to the required thickness. Finally, the substrate is soaked in warm acetone for lift-off.

Figure 12:
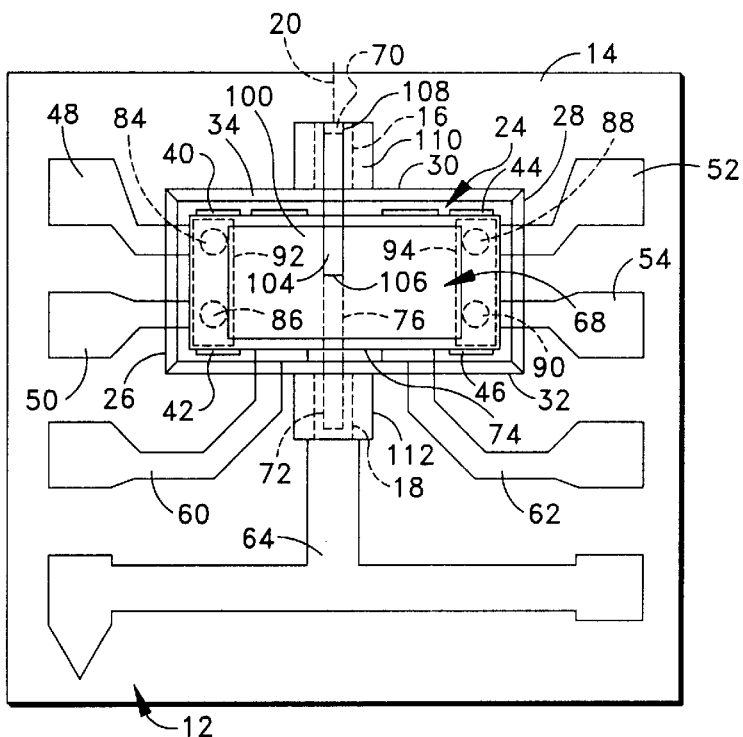

FIG. 12 is associated with the final processing to finish fabrication of the switch device 10. The top sacrificial layer of metal (e.g., aluminum that was deposited during the processing for the fulcrum rod 76 and contact bumps 84–90, described with reference to FIG. 6) is etched away. The etching is accomplished by soaking in concentrate photoresist developer. The negative photoresist material is removed utilizing a solvent such as hot kerosene. The polymethyl methacrylate is removed by soaking in a hot solvent such as acetone.

The bottom layer of sacrificial metal (e.g., aluminum) is etched away by soaking in concentrate photoresist developer. It should be realized that the bottom layer of sacrificial metal is the metal that was deposited during the portion of the process utilized to form the bottom contacts (see the description associated with FIG. 4). The substrate 12 is then cleaned in de-ionized water. A vacuum drying removes excess moisture.

The substrate 12 is then baked to stabilize the metal within the switch device 10. This baking process stabilizes all multiple metal layers. In one example, the baking is at 200–250° C. for 1 hr. to 72 hrs. Upon completion of the baking, if the switch device 10 is formed contemporaneously with a plurality of the switch devices on a single contiguous substrate, each device is separated using a die cut process.

From the above description of the invention, those skilled in the art will perceive improvements, changes and modifications. Such improvements, changes and modifications within the skill of the art are intended to be covered by the appended claims.

Having described the invention, the following is claimed:

1. A method of making a micro-miniature switch device that has at least one member movable relative to a substrate upon which the device is provided, said method comprising:
   providing a layer of sacrificial non-photolithography material upon a stratum connected to the substrate;
   photolithographing a photoresist material upon a stratum connected to the substrate to provide a template;
   providing a layer to comprise at least a portion of the movable member; and
   removing the photoresist material and the sacrificial non-photolithography material using photoresist developer.

2. A method as set forth in claim 1, wherein step of providing a layer of sacrificial non-photolithography material includes providing aluminum as the sacrificial non-photolithography material.

3. A method as set forth in claim 1, wherein step of providing a layer of sacrificial non-photolithography material includes providing copper as the sacrificial non-photolithography material.

4. A method as set forth in claim 1, wherein step of providing a layer to comprise at least a portion of the movable member includes providing material to define at least one contact portion of the movable member that is engagable with a portion of the device fixed to the substrate upon movement of the movable member.

5. A method as set forth in claim 1, including at least two photolithography process steps that utilize a single photolithographic mask.

6. A method as set forth in claim 5, wherein said two process steps that utilize a single photolithographic mask include a photolithography step prior to deposition of a sacrificial layer and a photolithography step after the deposition of the sacrificial layer.

7. A method as set forth in claim 1, including creating a recess into the substrate and providing at least a portion of the movable member at a location within the recess.

8. A method as set forth in claim 7, wherein said step of creating the recess into the substrate includes removing substrate material.

9. A method as set forth in claim 1, including creating a channel that extends into the substrate and providing at least a portion of the movable member at a location within the channel.

10. A method as set forth in claim 9, wherein said step of creating a recess into the substrate includes removing substrate material.

11. A method as set forth in claim 1, including creating a recess and at least one channel into the substrate, the channel intersecting the recess, and providing at least a portion of the movable member at a location within the recess and providing at least a portion of the movable member at a location within the channel.

12. A method as set forth in claim 11, wherein said steps of creating a recess and at least one channel into the substrate includes removing substrate material.

13. A method of making a micro-miniature switch device that has at least one member movable relative to a substrate upon which the device is provided, said method including removing substrate material to create a recess and at least one channel into the substrate, the channel intersecting the recess, and providing at least a portion of the movable member at a location within the recess and providing at least a portion of the movable member at a location within the channel.

14. A method as set forth in claim 13, including providing a layer of sacrificial non-photolithography material upon a stratum connected to the substrate, photolithographing a photoresist material upon a stratum connected to the substrate to provide a template, providing a layer to comprise at least a portion of the movable member, and removing the photoresist material and the sacrificial non-photolithography material using photoresist developer.

15. A method as set forth in claim 14, wherein step of providing a layer of sacrificial non-photolithography material includes providing aluminum as the sacrificial non-photolithography material.

16. A method as set forth in claim 14, wherein step of providing a layer of sacrificial non-photolithography material includes providing copper as the sacrificial non-photolithography material.

17. A method as set forth in claim 14, wherein step of providing a layer to comprise at least a portion of the movable member includes providing material to define at least one contact portion of the movable member that is engagable with a portion of the device fixed to the substrate upon movement of the movable member.

18. A method as set forth in claim 13, including at least two photolithography process steps that utilize a single photolithographic mask.

19. A method as set forth in claim 18, wherein said two process steps that utilize a single photolithographic mask include a photolithography step prior to deposition of a sacrificial layer and a photolithography step after the deposition of the sacrificial layer.

20. A method of making a micro-miniature switch device that has at least one member movable relative to a substrate upon which the device is provided, said method including:
   (1) photolithographing a first photoresist material upon a stratum connected to a substrate to provide a template, the first photolithograph step using a photolithographic mask; and
   (2) photolithographing a second photoresist material upon the stratum connected to the substrate to provide a template, the second photolithographic step using the same photolithographic mask as the photolithographic mask used for the first photolithographing step.

21. A method as set forth in claim 20, further comprising the step of providing a layer of sacrificial non-photolithography material upon a stratum connected to the substrate after the first photolithography step but before the second photolithography step.

22. A method as set forth in claim 21 further comprising the step of providing a layer to comprise at least a portion of the movable member, and removing the second photoresist material and the sacrificial non-photolithography material using photoresist developer.

23. A method as set forth in claim 22, wherein the step of providing a layer of sacrificial non-photolithography material includes providing aluminum as the sacrificial non-photolithography material.

24. A method as set forth in claim 22, wherein the step of providing a layer of sacrificial non-photolithography material includes providing copper as the sacrificial non-photolithography material.

25. A method as set forth in claim 22, wherein the step of providing a layer to comprise at least a portion of the movable member includes providing material to define at least one contact portion of the movable member that is engagable with a portion of the device fixed to the substrate upon movement of the movable member.

26. A method as set forth in claim 20, including creating a recess into the substrate and providing at least a portion of the movable member at a location within the recess.

27. A method as set forth in claim 26, wherein said step of creating the recess into the substrate includes removing substrate material.

28. A method as set forth in claim 26, including creating a channel that extends into the substrate and providing at least a portion of the movable member at a location within the channel.

29. A method as set forth in claim 28, wherein said step of creating a recess into the substrate includes removing substrate material.

* * * * *